US012619268B2

(12) United States Patent
Xue et al.

(10) Patent No.: US 12,619,268 B2
(45) Date of Patent: May 5, 2026

(54) CURRENT SENSING CIRCUIT WITH TEMPERATURE COEFFICIENT COMPENSATION

(71) Applicant: APPLE INC., Cupertino, CA (US)

(72) Inventors: Jing Xue, Saratoga, CA (US); Chongli Cai, San Jose, CA (US); Ziyu Xia, Cupertino, CA (US); Jitendra K Agrawal, San Jose, CA (US); Joey Yurgelon, San Jose, CA (US); Hao Zhou, San Jose, CA (US)

(73) Assignee: Apple Inc., Cupertino, CA (US)

( * ) Notice: Subject to any disclaimer, the term of this patent is extended or adjusted under 35 U.S.C. 154(b) by 179 days.

(21) Appl. No.: 18/584,774

(22) Filed: Feb. 22, 2024

(65) Prior Publication Data

US 2025/0271881 A1 Aug. 28, 2025

(51) Int. Cl.
*H02M 3/158* (2006.01)
*G01R 19/165* (2006.01)
*G01R 19/32* (2006.01)
*G05D 23/24* (2006.01)
*H02M 1/00* (2006.01)

(52) U.S. Cl.
CPC ... *G05D 23/2451* (2013.01); *G01R 19/16519* (2013.01); *G01R 19/32* (2013.01); *H02M 1/0009* (2021.05); *H02M 3/158* (2013.01); *H02M 3/1588* (2013.01)

(58) Field of Classification Search
CPC .......... G05D 23/2451; G01R 19/16519; G01R 19/32; H02M 1/0009; H02M 3/158; H02M 3/1588
See application file for complete search history.

(56) References Cited

U.S. PATENT DOCUMENTS

| | | | |
|---|---|---|---|
| 5,408,141 A * | 4/1995 | Devore | H03K 17/0822 |
| | | | 257/341 |
| 6,812,677 B2 | 11/2004 | Walters et al. | |
| 8,102,193 B2 | 1/2012 | Ha et al. | |
| 8,471,625 B1 * | 6/2013 | Zhou | G05F 3/30 |
| | | | 327/539 |
| 9,742,398 B2 * | 8/2017 | Chandrasekaran | |
| | | | H03K 17/6871 |
| 11,489,445 B2 | 11/2022 | Yan | |
| 11,837,955 B2 * | 12/2023 | Jovanovic | H02M 1/0009 |

* cited by examiner

*Primary Examiner* — Kyle J Moody
(74) *Attorney, Agent, or Firm* — Dickinson Wright RLLP

(57) ABSTRACT

A current sensing circuit includes a first field-effect transistor (FET) coupled to a first current source, an inductor, and a power FET, and includes a second FET coupled to a second current source. The current sensing circuit also includes a temperature circuit coupled to the first FET and the second FET. The temperature circuit is configured to compensate for one or more differences between one or more temperature coefficients of one or more of the first FET, the second FET, and the power FET.

20 Claims, 8 Drawing Sheets

CURRENT SENSING CIRCUIT WITH TEMPERATURE COEFFICIENT COMPENSATION

BACKGROUND

Technical Field

Embodiments described herein relate to integrated circuits, and more particularly, to techniques for measuring or sensing currents.

Description of the Related Art

Modern computer systems may include multiple circuits blocks designed to perform various functions. For example, such circuit blocks may include processors, processor cores configured to execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels for the different circuit blocks.

Power management circuits often include one or more power converter circuits configured to generate regulator voltage levels on respective power supply signals using a voltage level of an input power supply signal. Such regulator circuits may employ multiple passive circuit elements, such as inductors, capacitors, and the like.

SUMMARY OF VARIOUS EMBODIMENTS

Various embodiments of a current sensing circuit are disclosed. Broadly speaking, a current sensing circuit and/or a temperature circuit for the current sensing circuit are contemplated. The current measuring circuit may use the temperature circuit to compensate for differences in temperature coefficients between one or more field-effect transistors (FETs) of the current measuring circuit. The current measuring circuit may include a first FET, a second FET, an inductor, and the temperature circuit. The temperature circuit may include a first set of FETs, a second set of FETs, a first resistor, and a second resistor.

Various embodiments of a power converter circuit are also disclosed. Broadly speaking, the power converter circuit for sourcing a charge current to another device/circuit are contemplated. The power converter circuit may include a current sensing circuit configured to measure, detect, sense, etc., the amount of charge current sourced to the other device/circuit. The current measuring circuit includes a temperature circuit to compensate for differences in temperature coefficients between one or more field-effect transistors (FETs) of the current measuring circuit.

BRIEF DESCRIPTION OF THE DRAWINGS

The following detailed description makes reference to the accompanying drawings, which are now briefly described.

Figure 1:
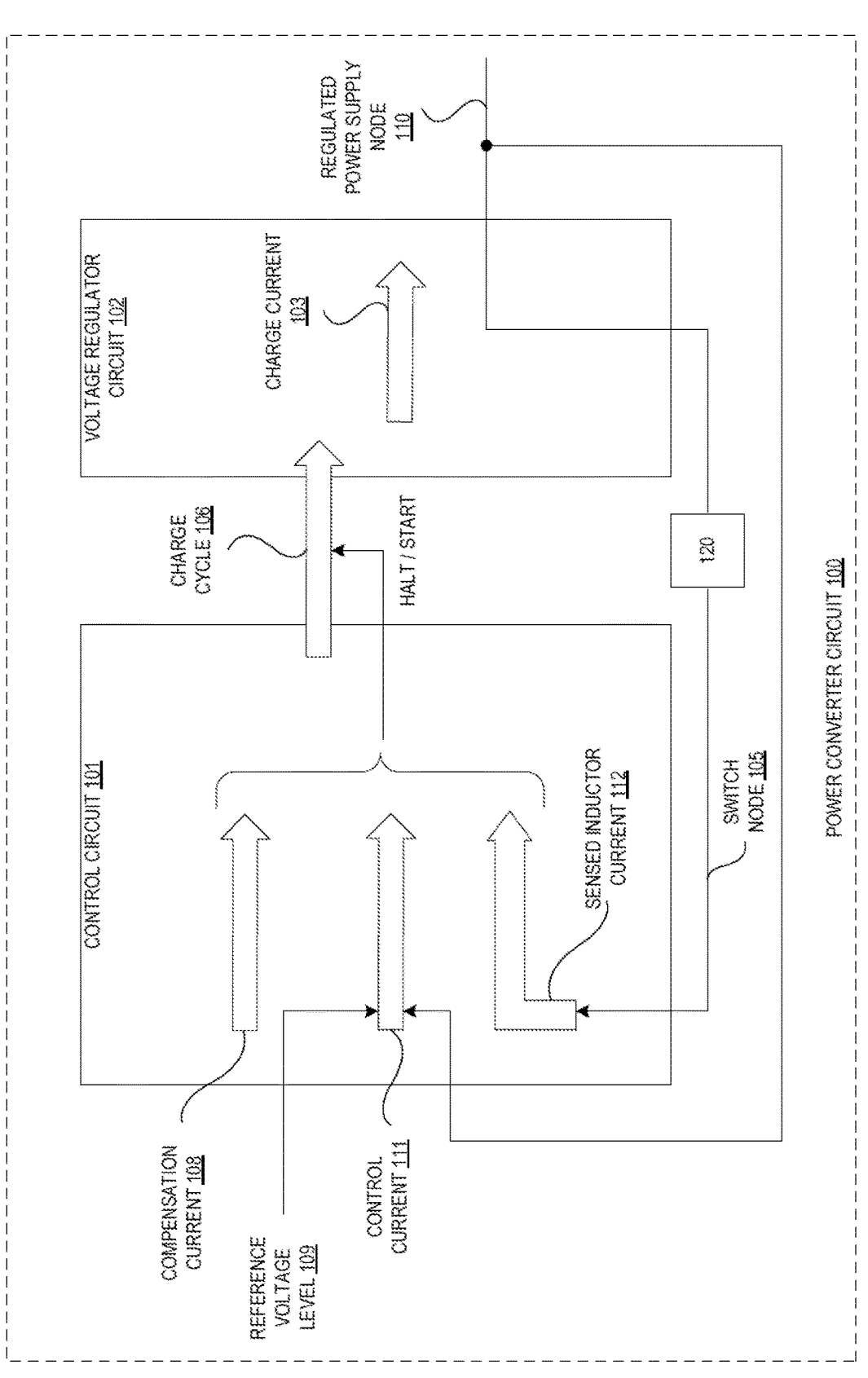
FIG. 1 illustrates a diagram of an example power converter circuit, in accordance with one or more embodiments of the present disclosure.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Computer systems may include multiple circuit blocks configured to perform specific functions. Such circuit blocks may be fabricated on a common substrate and may employ different power supply voltage levels. Power management units (commonly referred to as "PMUs") may include multiple power converter circuits configured to generate regulated voltage levels for various power supply signals. Such power converter circuits may employ regulator circuit that includes both passive circuit elements (e.g., inductors, capacitors, etc.) as well as active circuit elements (e.g., transistors, diodes, etc.).

Different types of voltage regulator circuits may be employed based on power requirements of load circuits, available circuit area, and the like. One type of commonly used voltage regulator circuit is a buck converter circuit. Such buck converter circuits include multiple devices and a switch node that is coupled to a regulated power supply node via an inductor and/or other circuit used to sense/measure current. Particular ones of the multiple devices are then activated to periodically charge and discharge the switch node in order to maintain a desired voltage level on power supply node.

To determine the duration of either the charge cycle or discharge cycle, current mode control may be used in some power converter circuits in order to provide a desired transient response of the power converter circuit as well as balance currents in multi-phase power converter circuits. In a power converter circuit using current mode control, control circuits may generate a control current whose values is based, at least in part, on a comparison of a voltage level of the regulated power supply node and a reference voltage. The control current may then be compared to a current that is flowing to an output of the power converter circuit to determine the duration of the charge or discharge cycle.

Because the power converter circuit uses the current flowing to the output of the to determine the duration of the charge cycle (e.g., when to start a charge cycle) or discharge cycle (e.g., when to halt a charge cycle), it may be important to accurately sense (e.g., detect, measure, etc.) the amount of current flowing to the output of the power converter circuit. Sensing the amount of current flowing to the output of the power converter circuit more accurately may allow the power converter circuit to operate more efficiently, use less power, etc.

Different circuits will often have different temperature coefficients. A temperature coefficient may indicate how a property of a circuit changes when the temperature of the circuit changes. For example, different field-effect transistors (FETs) will have different temperature coefficients. The temperature coefficient of a FET may indicate the change in a resistance of the FET when the temperature of the FET changes.

As discussed above, the power converter circuit may provide current to another device/circuit via one or more FETs (e.g., via a power FET). As current flows through the FET, the temperature of the FET may increase which may change the resistance of the FET. A current sensing circuit may use one or more FETs to sense (e.g., e.g., one or more sense FETs) the amount of current provided to the other device via the power FET. The resistance of sense FETs may also change as their temperatures increase. Because the sense FETs and the power FET may have different temperature coefficients, this may affect the accuracy of the current sensing circuit.

The embodiments illustrated in the drawings and described below may provide techniques for operating a current sensing circuit that has temperature coefficient compensation. For example, the current sensing circuit may compensate for the differences in the temperature coefficients of the FETs (e.g., of the sense FETs and the power FET). By compensating for the differences in the temperature coefficients, accuracy of the current sensing circuit may be improved.

FIG. 1 illustrates a block diagram of an example power converter circuit, in accordance with one or more embodiments of the present disclosure. As illustrated, power converter circuit 100 includes control circuit 101, voltage regulator circuit 102, and current sensing circuit 120.

Voltage regulator circuit 102 includes switch node 105 coupled to regulated power supply node 110 via current sensing circuit 120. In various embodiments, voltage regulator circuit 102 is configured, in response to an initiation of charge cycle 106, to source charge current 103 to switch node 105. It is noted that although a single voltage regulator circuit is depicted in the embodiment of FIG. 1, in other embodiments, multiple voltage regulator circuits (collectively "phase units" or "phase circuits") may be coupled to regulated power supply node 110, in parallel, and operated with different timings (or "phases").

As noted above, the duration of charge and discharge cycles in a power converter circuit may be determined using current control. As illustrated in FIG. 1, control circuit 101 is configured, in response to an initiation of charge cycle 106, to generate control current 111 using a voltage level of regulated power supply node 110 and reference voltage level 109. In various embodiments, control circuit 101 initiates charge cycle 106 in response to an assertion of a clock or other signal (e.g., a timing signal).

Control circuit 101 is also configured to generate compensation current 108. In various embodiments, compensation current 108 may be used to perform slope compensation on sensed inductor current 112. Compensation current 108 may be an increasing ramp signal with a fixed slope that is activated in response to the assertion of the clock or other timing signal. As used herein, sensed inductor current 112 is a current that is flowing through a current sensing circuit 120 during a charge cycle. In various embodiments, sensed inductor current 112 may be inferred from a voltage level of switch node 105, measured using a current sensing circuit 120. The current sensing circuit 120 may measure the voltage level of the switch node 105 using a voltage drop across a resistor in series with an inductor, or any other suitable circuit or technique for sensing and/or measuring current.

Current sensing circuit 120 is configured to sense (e.g., detect, measure, estimate, etc.) the current that is generated by the power converter circuit 100. The power converter circuit 100 (e.g., the control circuit 101) may control the operation of the power converter circuit 100 based on the measured current. For example, the duration of charge and discharge cycles in a power converter circuit 100 may be determined based on the current that is sensed by the current sensing circuit.

Although the current sensing circuit 120 is illustrated as separate from the control circuit 101 and the voltage regulator circuit 102, the current sensing circuit 120 may be part of the control circuit 101 and/or the voltage regulator circuit 102. For example, the current sensing circuit 120 may be part of the control circuit 101. In another example, the current sensing circuit 120 may be part of the voltage regulator circuit 102. In a further example, a portion of the current sensing circuit 120 may be included in the control circuit 101 and another portion of the current sensing circuit 120 may be included in the voltage regulator circuit 102. The current sensing circuit 120 is discussed in more detail below.

In addition to generating compensation current 108, control circuit 101 is also configured to halt and/or start charge cycle 106 using control current 111, sensed inductor current 112, and compensation current 108. In various embodiments, control circuit may combine sensed inductor current 112 and compensation current 108, and compare a result current to control current 111.

As discussed above, the power converter circuit 100 uses the current flowing to the regulated power supply node 110 (e.g., and output of the power converter circuit 100) to determine the duration of the charge cycle 106. Sensing the amount of current flowing to the output of the power converter circuit more accurately may allow the power converter circuit 100 to operate more efficiently, use/waste less power, to generate less heat, etc.

Because different FETs have different temperature coefficients (e.g., have different resistances at a particular temperature), it may be more difficult to sense the amount of current flowing to the regulated power supply node 110. In one embodiment, the current sensing circuit may compensate for the differences in the temperature coefficients of various FETs. By compensating for the differences in the temperature coefficients, accuracy of the operation of the power converter circuit 100 may be improved (e.g., the power converter circuit 100 may operate more efficiently).

Figure 2:
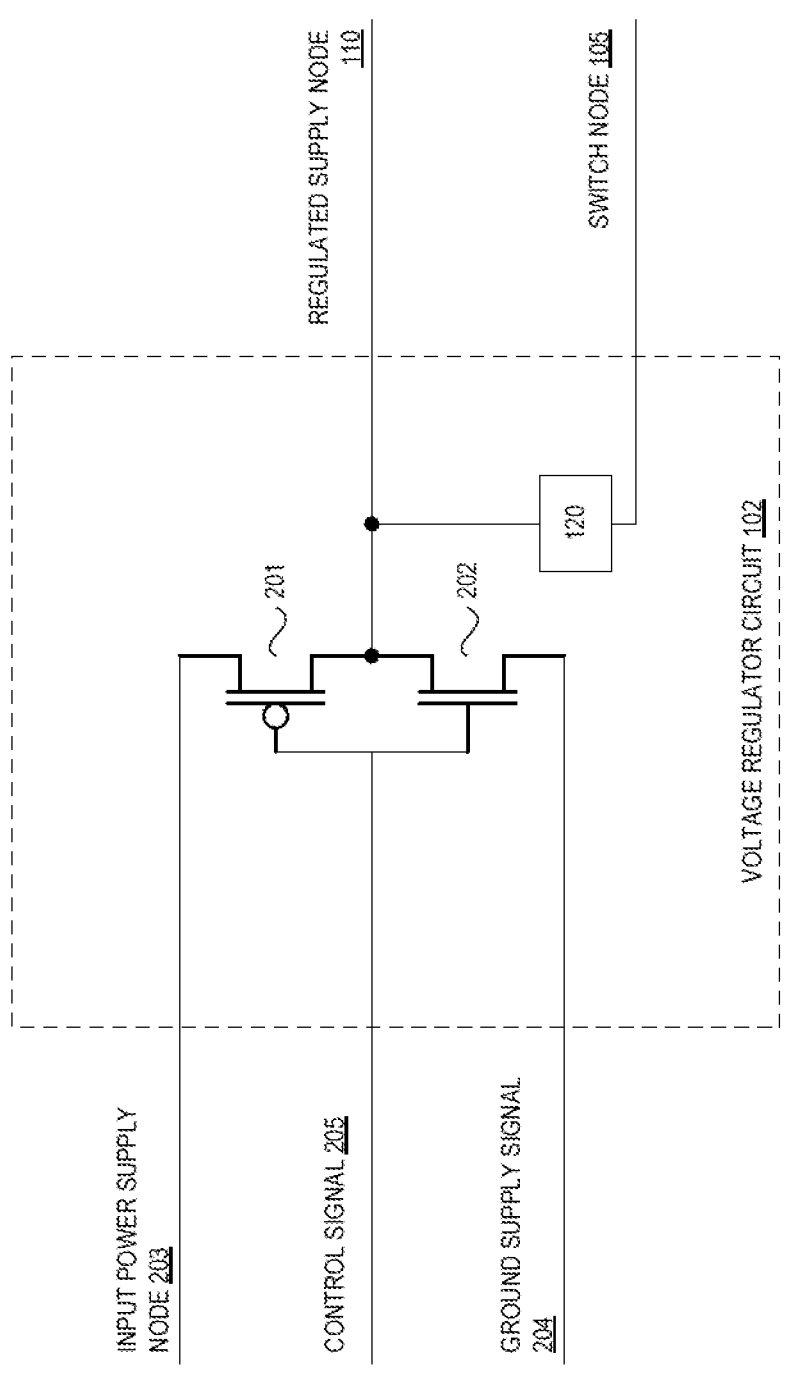
FIG. 2 illustrates a diagram of an example voltage regulator circuit, in accordance with one or more embodiments of the present disclosure.

FIG. 2 illustrates a diagram of an example voltage regulator circuit 102, in accordance with one or more embodiments of the present disclosure. Voltage regulator circuits, such as voltage regulator circuit 102, may be designed according to one of various design styles. A schematic diagram of a particular embodiment of voltage regulator circuit 102 is depicted in FIG. 2. As illustrated, voltage regulator circuit 102 includes devices 201 and 202, which are both coupled to switch node 105, and controlled by control signal 205.

In various embodiments, control circuit 101 may generate control signal 205, which is used to activate one of devices 201 and 202 during charge and discharge cycles. During a charge cycle, current is sourced from input power supply node 203 to regulated power supply node 110, and during a discharge cycle, current is sunk from regulated power supply node 110 into ground supply node 204. Alternating between charge and discharge cycles, and adjusting the duration of either of the charge or discharge cycles may maintain a desired voltage level maintained on regulated power supply node 110.

Device 201 is coupled between input power supply node 203 and switch node 105, and is controlled by control signal 205. During a charge cycle, control signal 205 is asserted, which activates device 201 and couples input power supply node 203 to switch node 105, thereby charging switch node 105 by allowing a current to flow from input power supply node 203 to switch node 105, and then onto regulated power supply node 110. As described below in more detail, the duration of the charge cycle may be based on a comparison of a generated current to a combination of generated and sensed currents.

In one embodiment, the switch node 105 may be coupled to current sensing circuit 120. The current sensing circuit

120 may measure, sense, or detect the current flowing through the regulated power supply node 110, as discussed in more detail below.

As used herein, asserting, or an assertion of, a signal refers to setting the signal to a particular voltage level that activates a circuit or device coupled to the signal. The particular voltage level may be any suitable value. For example, in the case where device 201 is p-channel MOS-FET, control signal 205 may be set to a voltage at or near ground potential when activated.

Device 202 is coupled between switch node 105 and ground supply node 204, and is also controlled by control signal 205. During a discharge cycle, control signal 205 is set to a voltage level, which activates device 202 and couples switch node 105 to ground supply node 204, thereby providing a conduction path from regulated power supply node 110 into ground supply node 204. While device 202 is active, current flows from regulated power supply node 110 into ground supply node 204, decreasing the voltage level of regulated power supply node 110.

Device 201 and device 202 may be particular embodiments of MOSFETs. In particular, device 201 may be a particular embodiment of a p-channel MOSFET and device 202 may be a particular embodiment of an n-channel MOS-FET. Although only two devices are depicted in the embodiment of FIG. 2, in other embodiments, any suitable number of devices, coupled in series or parallel, may be employed to achieve particular electrical characteristics (e.g., on-resistance of the devices).

Figure 3:
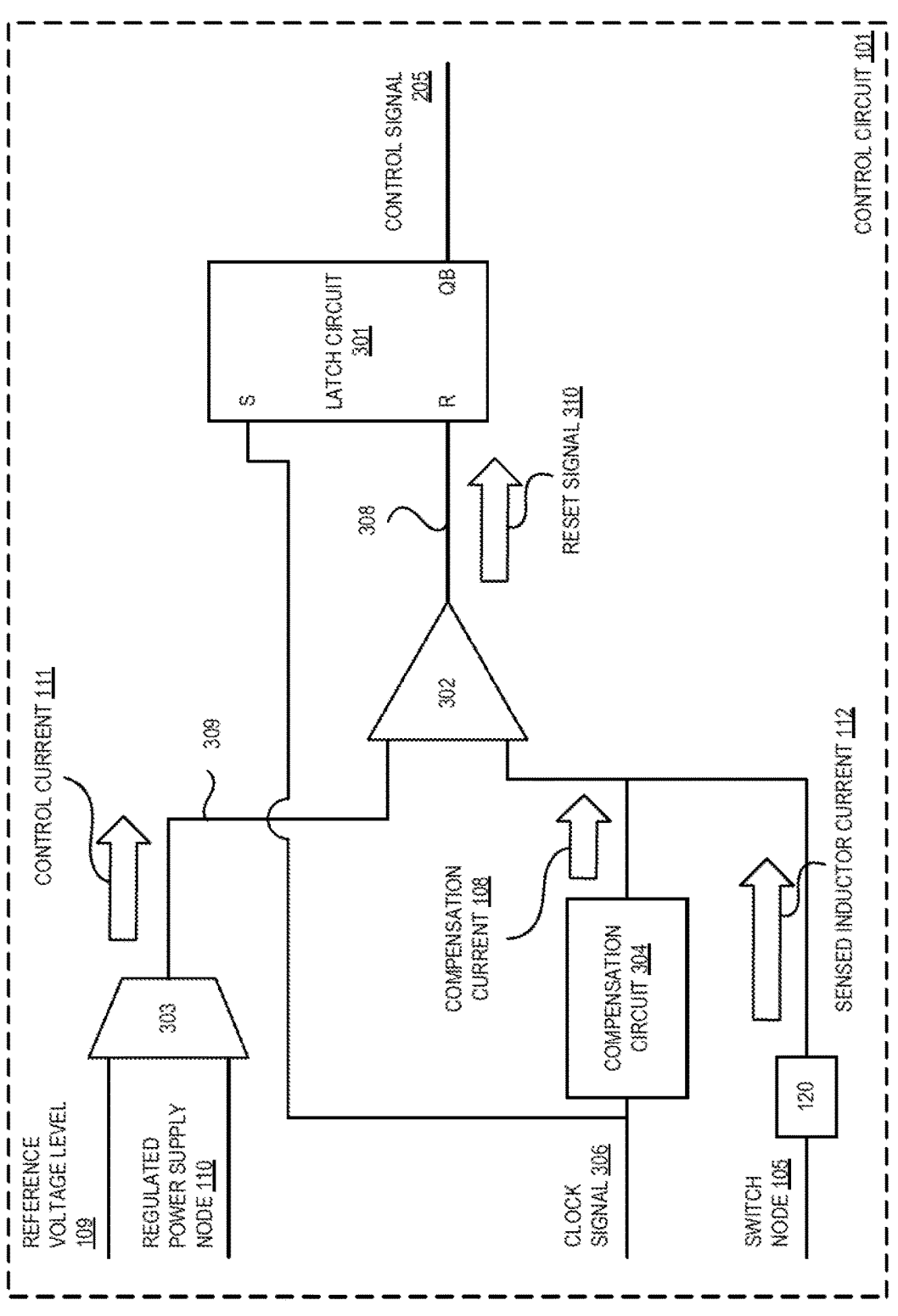
FIG. 3 illustrates a block diagram of an example control circuit for a power converter circuit, in accordance with one or more embodiments of the present disclosure.

FIG. 3 illustrates a block diagram of an example control circuit 101 for a power converter circuit, in accordance with one or more embodiments of the present disclosure. As illustrated, control circuit 101 includes latch circuit 301, comparator circuit 302, comparator circuit 303, and compensation circuit 304.

Latch circuit 301 may be a particular embodiment of a Set-Reset (SR) latch configured to set control signal 205 to a low logic value in response to an assertion of clock signal 306. Additionally, Latch circuit 301 is configured to set control signal 205 to a high logic level in response as assertion of reset signal 310 on node 308.

Latch circuit 301 may be designed according to one of various design styles. In various embodiments, latch circuit 301 may include multiple logic gates, such as, cross-coupled NAND gates, or any other suitable combination of logic gates and/or MOSFETs to implement the functionality described above.

Comparator circuit 302 is coupled to latch circuit 301 via node 308, and may be a particular embodiment of a differential amplifier configured to generate reset signal 310 on node 308 using control current 111 and a combination of compensation current 108, and sensed inductor current 112. In various embodiments, comparator circuit 302 may be configured to set reset signal 310 to a particular digital voltage level using results of comparing control current 111 to the combination of compensation current 108, and sensed inductor current 112. For example, when a value of control current 111 is substantially the same as the combination of compensation current 108, and sensed inductor current 112, comparator circuit 302 may set the voltage level of reset signal 310 to a voltage level corresponding to a high logic level.

Comparator circuit 303 is coupled to comparator circuit 302 via node 309, and may be a particular embodiment of a transconductance amplifier configured to generate control current 111 in node 309. The value of control current 111 may be based, at least in part, on a comparison of reference voltage level 109 and the voltage level of regulated power supply node 110. In various embodiments, comparator circuit 303 may amplify a difference between reference voltage level 109 and the voltage level of regulated power supply node 110, and convert the difference in voltage levels to control current 111.

Compensation circuit 304 is coupled to clock signal 306 and switch node 105, and is configured to generate compensation current 108. In various embodiments, compensation circuit 304 is configured to generate compensation current 108 in response to an assertion of clock signal 306. Compensation circuit 304 may be further configured to source (or add) compensation current 108 to sensed inductor current 112 to generate a sum of the two currents. Switch node 105 is also coupled to current sensing circuit 120. The current sensing circuit 120 may measure, sense, or detect the current flowing through the regulated power supply node 110, which may be referred to as an inductor current. The current sensing circuit 120 may also compensate for differences in the temperature coefficients of various FETs, as discussed in more detail below.

Figure 4:
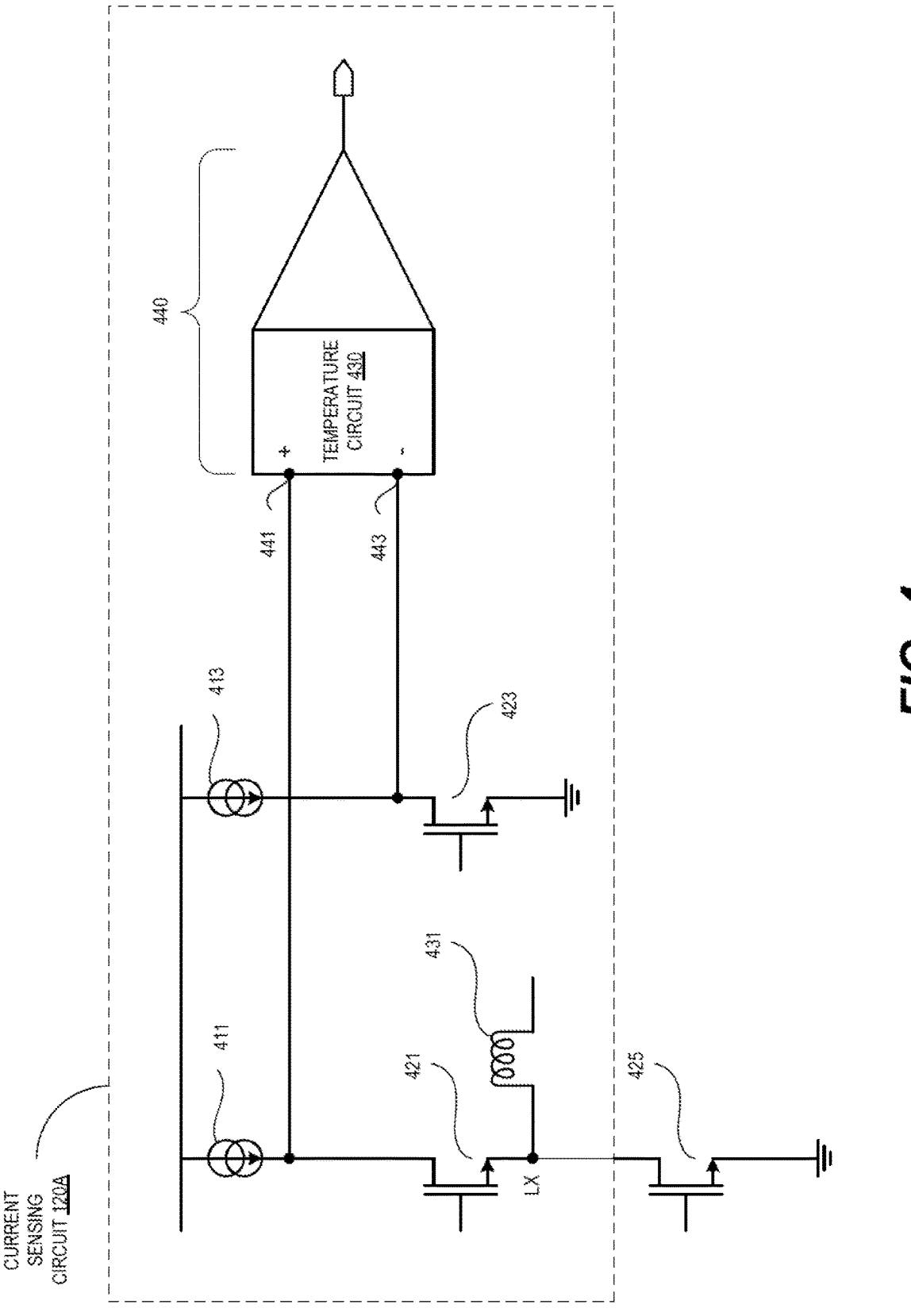
FIG. 4 illustrates a block diagram of an example current sensing circuit, in accordance with one or more embodiments of the present disclosure.

FIG. 4 illustrates a block diagram of an example current sensing circuit 120A, in accordance with one or more embodiments of the present disclosure. Measuring, detecting, sensing, etc., current may be accomplished using a variety of circuit designs. Current sensing circuit 120A may be a particular embodiment of current sensing circuit 120 illustrated in FIGS. 1-3. As illustrated, current sensing circuit 120A includes current source 411, current source 413, FET 421, FET 423, FET 425, inductor 431, and comparator circuit 440.

FET 421, which may be a particular embodiment of an n-channel MOSFET, is coupled between the current source 411 and the FET 425. The FET 421 may be another type of FET, such as a p-channel MOSFET in other embodiments. FET 425 is coupled to between FET 421 and a ground node. An inductor 431 (e.g., an inductor circuit or any other appropriate combination of circuits that opposes a change in current) is coupled between the FET 421 and the FET 425. FET 423, which may be a particular embodiment of an n-channel MOSFET, is coupled between current source 413 and a ground node. FET 421 and/or FET 423 may be referred to as sense FETs (e.g., a FET that is used to measure/detect current).

The current source 411 generates a first current (which may be referred to as a demand current) that flows to the ground node via FET 421 (e.g., a sense FET) and FET 425 (e.g., a power FET). An inductor current may also flow through the FET 425. The current source 413 may generate a second current (which may be referred to as an offset current) that flows to the ground node via FET 412 (e.g., a sense FET).

In one embodiment, the comparator circuit 440 may include a current comparator and/or any appropriate circuit that compares multiple voltages/currents. As illustrated in FIG. 4, the comparator circuit 440 also includes a temperature circuit 430. The temperature circuit 430 may be referred to as an input or an input stage to the comparator circuit 440. In one embodiment, the temperature circuit 430 may compensate for differences in the temperature coefficients of the FET 421, FET 423 (e.g., sense FETs), and/or FET 425 (e.g., a power FET). For example, FET 421 and/or FET 423 may have temperature coefficients that are different than the temperature coefficient of FET 425. The temperature circuit 430 may allow the current sensing circuit 120A to more accurately sense/measure the current from the current source

411 (e.g., the demand current), even though the FET 421, FET 423, and FET 425 may have different temperature coefficients.

The temperature circuit 430 includes two inputs 441 and 443. The input 441 is coupled to the current source 411 between the current source 411 and the FET 421. The input 441 provides a first current from the current source 411 to the temperature circuit 430. The input 443 is coupled to the current source 413 between the current source 411 and the FET 423. The input 443 provides a second current from the current source 413 to the temperature circuit 430.

In one embodiment, the temperature circuit 430 converts the first current (received from current source 411) into a first voltage and converts the second current (received from current source 413) into a second voltage. The comparator circuit 440 may compare the first voltage and the second voltage as discussed in more detail below. The temperature circuit 430 may also compensate for differences in the temperature coefficients of FET 421, FET 423, and/or FET 425, as discussed in more detail below.

In one embodiment, the comparator circuit 440 may output, generate, send, etc., a signal when the current flowing through FET 425 (e.g., a power FET) matches a target current. The target current may be determined based on a difference between the current from current source 411 and the current from current source 413. If the voltage received at input 441 matches the voltage received at input 443, the comparator circuit may output a signal indicating that the current flowing through FET 425 matches a target current (e.g., a desired, requested, etc., current). The comparator circuit 440 may also generate additional signals to indicate whether the current flowing through FET 425 is greater than or less than the target current.

In one embodiment, control circuit 101 (illustrated in FIGS. 1 and 3) may control operation of the power converter circuit 100 based on the signal received from the comparator circuit 440. For example, the control circuit 101 may halt a charge cycle when the signal (indicated that the first current matches a target or threshold current) is received from the comparator circuit 440. In another example, the control circuit 101 may initiate/start a charge cycle based on the signal received form the comparator circuit 440.

In one embodiment, characteristics of the FET 421 and the FET 423 may be based on the FET 425. For example, temperature coefficients of FET 421 and/or the FET 423 may be similar to or within a range/threshold of the temperature coefficient of FET 425. In a further example, the resistances of FET 421 and/or the FET 423 may be similar to or within a range/threshold of the resistance of FET 425. In a further example, the size, length, width, etc., of the FET 421 and/or the FET 423 be similar to the size, length, width, etc., of FET 425.

Although current source 411 and current source 413 are illustrated in FIG. 4 as being part of the current sensing circuit 120A, the current source 411 and/or current source 413 may be external to the current sensing circuit 120A in other embodiments. For example, the current source 411 may be another circuit that is separate from the current sensing circuit 120A and may be coupled to the current sensing circuit via one or more wires, lines, connections, traces, conduits, etc.

As illustrated in FIG. 4, FET 425 may be external to the current sensing circuit 120A. For example, FET 425 may be FET that is coupled to the current sensing circuit 120A. In one embodiment, the current sensing circuit 120A may be part of a power converter circuit 100. The FET 425 may be external to the power converter circuit 100 but may be coupled to the current sensing circuit 120A via one or more wires, lines, connections, traces, conduits, etc. In another embodiment, the FET 425 may be a gallium nitride (GaN) FET. The FET 425 may also be referred to as a power FET (e.g., a FET that is used to provide current or power to another circuit/device).

Figure 5:
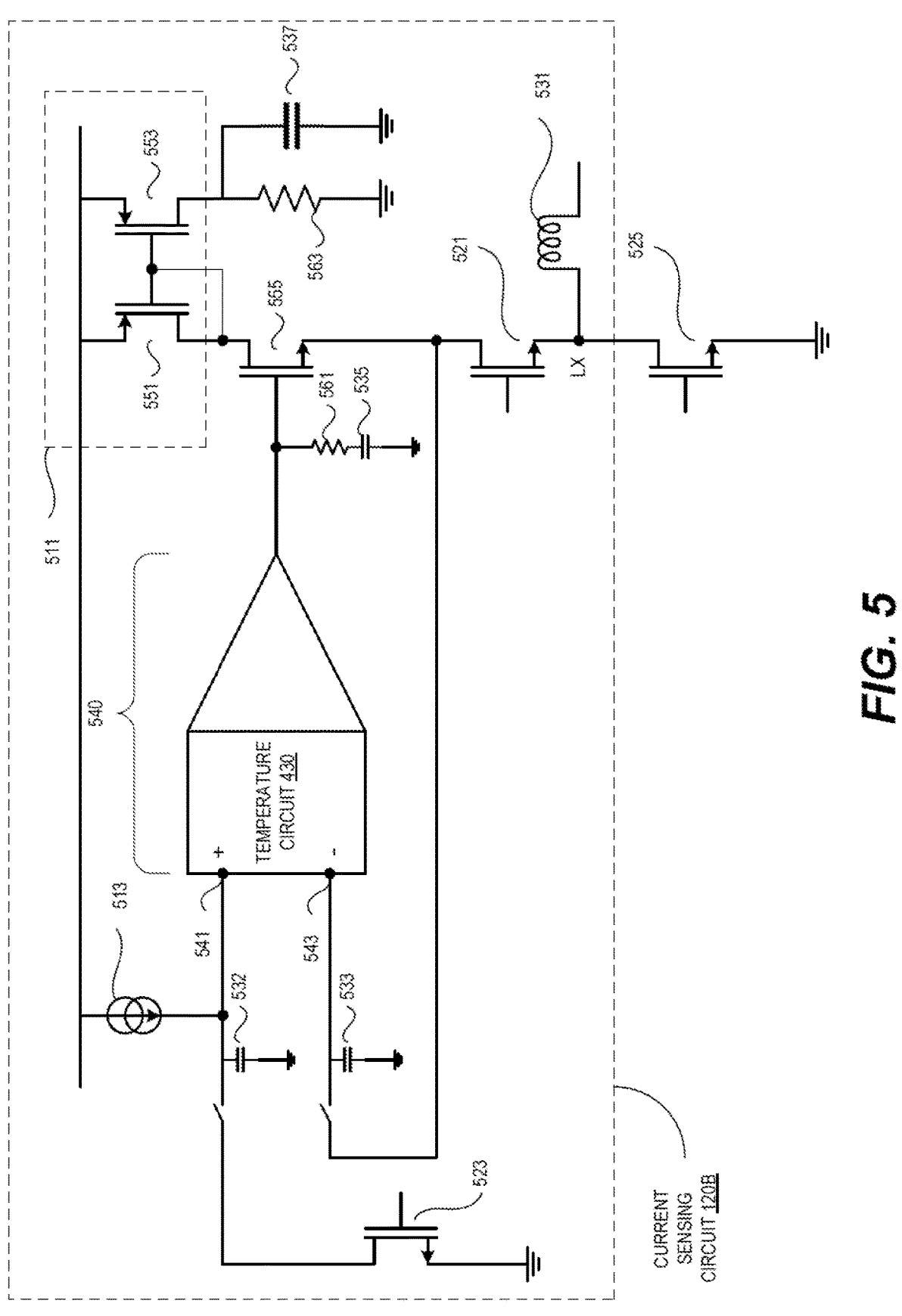
FIG. 5 illustrates a block diagram of an example current sensing circuit, in accordance with one or more embodiments of the present disclosure.

FIG. 5 illustrates a block diagram of an example current sensing circuit 120B, in accordance with one or more embodiments of the present disclosure. Current sensing circuit 120B may be a particular embodiment of current sensing circuit 120 illustrated in FIGS. 1-3. Measuring, detecting, sensing, etc., current may be accomplished using a variety of circuit designs. A particular embodiment of such a circuit is depicted in FIG. 5. As illustrated, current sensing circuit 120B includes current source 511, current source 513, FET 521, FET 523, FET 525, inductor 531, amplifier circuit 540, capacitor 532, capacitor 533, capacitor 535, capacitor 537, resistor 561, and resistor 563. FETs 521 and 523 may be sense FETs and FET 525 may be a power FET.

Current source 511 is coupled to resistor 563 and the resistor 563 is coupled to a ground node. Current source 511 is also coupled to a capacitor 537 and the capacitor 537 is coupled to a ground node. The current source 511 includes FET 551 and FET 553. FET 551 and FET 553 may be particular embodiments of a p-channel MOSFET. The current source 511 is further coupled to an input/source of FET 555, which may be a particular embodiment of an n-channel MOSFET. The output/drain of FET 555 is coupled to FET 521. The gate of FET 555 is coupled to an output of the amplifier circuit 540.

FET 521, which may be a particular embodiment of an n-channel MOSFET, is coupled between FET 555 and the FET 525. FET 525 is coupled to between FET 521 and a ground node. An inductor 531 (e.g., an inductor circuit or any other appropriate combination of circuits that opposes a change in current) is coupled between the FET 521 and the FET 525 at node LX.

The current source 511 may generate a first current that flows to the ground node via FET 555, FET 521, and FET 525. In addition, an inductor current may flow through FET 525 (e.g., a power FET) and inductor 531, as discussed above. The first current (generated by the current source 511) may be provided to input 543 of the amplifier circuit 540 via FET 555. In one embodiment, the current sensing circuit 120B may be referred to as a closed-loop circuit because the output of the current sensing circuit 120B (e.g., the current that is provided to the FET 525) is provided back to input 543.

In one embodiment, the first current may be an average current. For example, the first current may be an average of a demand current (e.g., a current that is supplied to another circuit/device) over a period of time. The first current generated by the current source 511 may be referred to as an average current or an average sensed current.

Current source 513 is coupled to FET 523, a capacitor 532, and input 541 of the amplifier circuit 540. Current source 513 may generate a second current (which may be referred to as an offset current) that flows to a ground node via FET 523. The second current may also be provided to capacitor 535 and the input 541 of the amplifier circuit 540.

The output of amplifier circuit 540 is coupled to the gate of FET 555 and a resistor 561. The resistor 561 is coupled to a capacitor 535 and the capacitor 535 is coupled to a ground node. As illustrated in FIG. 5, the amplifier circuit 540 includes a temperature circuit 430. In one embodiment, the amplifier circuit 540 may also include an amplifier (e.g., an operational amplifier or op amp) and/or any appropriate circuit that compares multiple voltages/currents. The temperature circuit 430 may be referred to as an input or an input stage to the amplifier circuit 540. In one embodiment, the temperature circuit 430 may compensate for differences in the temperature coefficients of the FET 521, FET 523, and/or FET 525. The temperature circuit may allow the current sensing circuit 120B to sense/measure the current from the current source 511 (e.g., the demand current) more accurately, even though the FET 521, FET 523, and/or FET 525 may have different temperature coefficients.

The temperature circuit 430 includes two inputs. The input 543 is coupled to current source 511 between the FET 555 and the FET 521. The input 541 provides the first current from current source 511 (which is received via FET 555) to the temperature circuit 430. The input 541 is coupled to current source 513. The input 543 provides a second current (e.g., an offset current from current source 513) to the temperature circuit 430.

In one embodiment, the temperature circuit 430 converts the current received from current source 511 (e.g., an average current) into a first voltage and converts the current received from current source 513 (e.g., an offset current) into a second voltage. The amplifier circuit 540 may compare the first voltage and the second voltage as discussed in more detail below.

In one embodiment, the amplifier circuit 540 may output, generate, send, etc., a signal and/or voltage that is proportional to the inductor current flowing through FET 525 and inductor 531. For example, the amplifier circuit 540 and FET 555 may form a negative closed loop. The negative closed loop may regulate the voltage at input 541 and input 543 to the same voltage. In one embodiment, the voltage caused by inductor current flowing through FET 525 and the voltage caused by the current from current source 511 flowing though FET 521 may be equal to the voltage caused by current from current source 513 flowing through FET 523. Because the current from current source 513 may be fixed and/or known, the current from current source 511 will mirror the inductor current flowing through FET 525.

In one embodiment, characteristics of the FET 521 and the FET 523 may be based on the FET 525. For example, the temperature coefficients of FET 521 and/or the FET 523 may be similar to or within a range/threshold of the temperature coefficient of FET 525. In a further example, the resistances of FET 521 and/or the FET 523 may be similar to or within a range/threshold of the resistance of FET 525. In a further example, the size, length, width, etc., of the FET 521 and/or the FET 523 be similar to the size, length, width, etc. of FET 525.

Although current source 511 and current source 513 are illustrated in FIG. 5 as being part of the current sensing circuit 120B, current source 511 and current source 513 may be external to the current sensing circuit 120B in other embodiments. For example, the current source 511 may be another circuit that is separate from the current sensing circuit 120B and may be coupled to the current sensing circuit 120B via one or more one or more wires, lines, connections, traces, conduits, etc.

As illustrated in FIG. 5, FET 525 may be external to the current sensing circuit 120B. For example, FET 525 may be FET that is coupled to the current sensing circuit 120B. In one embodiment, the current sensing circuit 120B may be part of a power converter circuit 100. The FET 525 may be external to the power converter circuit 100 but may be coupled to the current sensing circuit 120B via one or more wires, lines, connections, traces, conduits, etc.

In various embodiments, FET 521, FET 523, and FET 525 may be particular embodiments of a transmission gate or other suitable combination of FETs, MOSFETs, etc., configured to couple current source 511 and current source 513 to the ground nodes. One or more of capacitor 532, capacitor 533, capacitor 535, and capacitor 537 may be fabricated using a metal-oxide-metal structure, or any other suitable structure available on a semiconductor manufacturing process using to fabricate power converter circuit 100.

Figure 6:
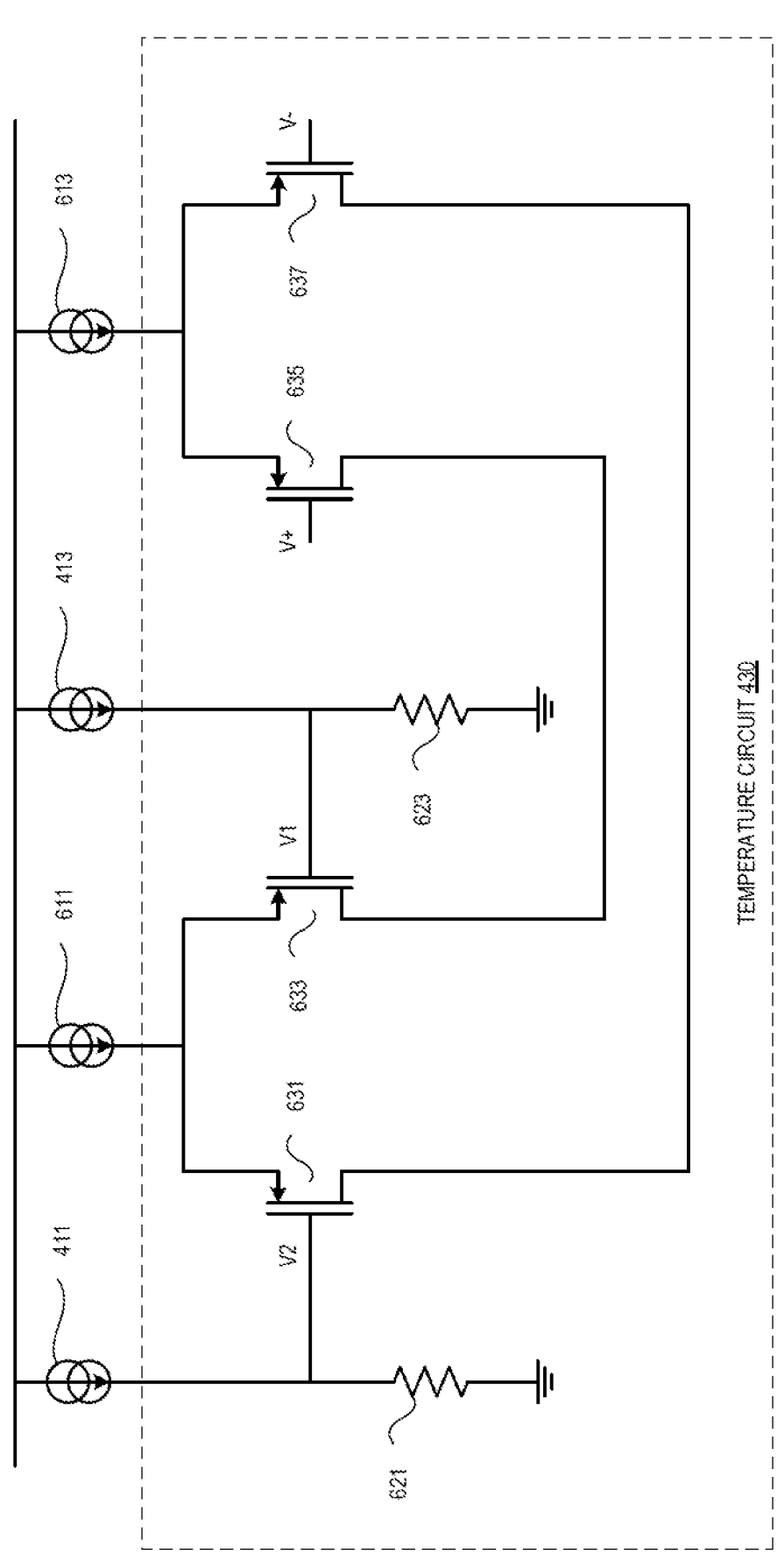
FIG. 6 illustrates a block diagram of an example temperature circuit, in accordance with one or more embodiments of the present disclosure.

FIG. 6 illustrates a block diagram of an example temperature circuit 430, in accordance with one or more embodiments of the present disclosure. As discussed above, the temperature circuit 430 allows the current sensing circuit 120 (e.g., current sensing circuit 120A and/or current sensing circuit 120B) to compensate for different temperature coefficients of different field effect transistors (FETs). The temperature circuit 430 may be part of a comparator circuit, such as comparator circuit 440 and/or amplifier circuit 540. The temperature circuit 430 may be accomplished using a variety of circuit designs. A particular embodiment of such a circuit is depicted in FIG. 6. As illustrated, temperature circuit 430 includes FET 631, FET 633, FET 635, FET 637, resistor 621, and resistor 623.

Current source 411 is coupled to a resistor 621 (e.g., a resistor circuit or some other appropriate circuit that provides resistance to the flow of current) and the resistor 621 is coupled to a ground node. The current source 411 is also coupled to a gate of the FET 631. The current source 411 provides a first current (e.g., a demand current) to the resistor 621 and to the gate of the FET 631. Current source 413 is coupled to a resistor 623 and the resistor 623 is coupled to a ground node. The current source 413 is also coupled to a gate of FET 633. The current source 413 provides a second current (e.g., an offset current) to the resistor 623 and to the gate of the FET 633

Current source 611 is coupled to the FET 631 and the FET 633. For example, current source 611 is coupled to the inputs/sources of the FET 631 and the FET 633. Current source 611 provides a current (e.g., a bias current) to the FET 631 and the FET 633. Current source 613 is coupled to FET 635 and FET 637. For example, current source 613 is coupled to the inputs/sources of the FET 635 and the FET 637. Current source 613 provides a current (e.g., a bias current) to the FET 635 and the FET 637.

As discussed above, current source 411 provides a first current (e.g., a demand current) to the resistor 621. The first current may be referred to as $i_{dem}$. The first current is also provided to the gate of FET 631. The voltage at the gate of FET 631 is represented as V2. Also as discussed above, the current source 413 provides a second current (e.g., an offset current) to the resistor 623. The second current may be referred to as $i_{os}$. The second current is also provided to the gate of FET 633. The voltage at the gate of FET 633 is represented as V1. The voltage at inputs 441 and 541 (illustrated in FIGS. 4 and 5) may be represented as $V_+$. The voltage at inputs 443 and 543 (illustrated in FIGS. 4 and 5) may be represented as $V_-$.

In one embodiment, referring to FIG. 4, the gate of FET 635 may be coupled to the current source 411 and the gate of FET 637 may be coupled to the current source 413. In another embodiment, referring to FIG. 5, the gate of FET 635 may be coupled to the current source 411 and the gate of FET 637 may be coupled to the current source 413.

In one embodiment, the comparator circuit that includes the temperature circuit 430 (e.g., comparator circuit 440 and/or comparator circuit 540) may transmit a signal when the following relationship depicted in Equation 1 is satisfied.

The signal may indicate that the first current (e.g., a demand current or an average current) received by the current sensing circuit 120 matches a target current.

$$V_+ + V_1 = V_- + V_2 \tag{1}$$

$V_+$ may be defined as $i_{dem}*R_{SNS}-i_{LX}*R_{powerFET}$, where $i_{dem}$ is the demand current, $R_{SNS}$ is the resistance of the FET 421 and/or FET 423, $i_{zx}$ is the inductor current flowing through node LX, and $R_{GAN}$ is the resistance of the FET 425. $V_1$ may be defined as $i_{os}*R_{res}$, where $i_{os}$ is the offset current and $R_{res}$ is the resistance of the resistors 621 and 623. $V_-$ may be defined $i_{os}*R_{SNS}$. $V_2$ may be defined as $i_{dem}*R_{res}$. By substituting in the above defined terms, Equation 2 may be obtained.

$$(i_{dem}*R_{SNS} - i_{LX}*R_{powerFET}) + (i_{os}*R_{res}) = (i_{os}*R_{SNS}) + (i_{dem}*R_{res}) \tag{2}$$

In one embodiment, the temperature circuit 430 may compensate for different temperature coefficients of different FETs by adjusting the resistances of resistor 621 and/or resistor 623 (e.g., by adjusting $R_{res}$ in Equation 2). For example, resistor 621 and/or resistor 623 may be adjustable resistors (e.g., a resistor or resistor circuit where the resistance can be changed, adjusted, etc.). Adjusting the resistance $R_{res}$ of the resistor 621 and/or resistor 623 allows the temperature circuit 430 to compensate for differences between the temperature coefficients of the sense FETs (e.g., FET 421, FET 423, FET 521, and/or FET 523) and the power FETs (e.g., FET 425 and/or FET 525). For example, the resistance R of the resistor 621 and/or resistor 623 may be adjusted (e.g., increased or decreased) until Equation (1) and/or Equation (2) are satisfied.

In one embodiment, the temperature circuit 430 may compensate for different temperature coefficients of different FETs by adjusting an offset current (e.g., a second current). For example, the amount of current in the offset current may be adjusted (e.g., increased or decreased). Adjusting the amount of current in the offset current allows the temperature circuit 430 to compensate for differences between the temperature coefficients of the sense FETs (e.g., FET 421, FET 423, FET 521, and/or FET 523) and the power FETs (e.g., FET 425 and/or FET 525). For example, the amount of current in the offset current may be adjusted (e.g., increased or decreased) until Equation (1) and/or Equation (2) are satisfied.

In one embodiment, the temperature circuit 430 may be configured to compensate for different temperature coefficients of different FETs during the manufacturing and/or installation of the power converter circuit 100. For example, during the manufacturing process of the power converter circuit 100 (which includes the temperature circuit 430), the temperature circuit 430 may be configured to compensate for different temperature coefficients of different FETs (e.g., resistances and/or amounts of current may be adjusted). In another example, when the power converter circuit 100 is installed into a device (e.g., installed in a computing/electronic device), the temperature circuit 430 may be configured to compensate for different temperature coefficients of different FETs.

In one embodiment, the temperature circuit 430 may be configured to compensate for different temperature coefficients of different FETs after the power converter circuit 100 has been installed in an electronic/computing device. For example, after the power converter circuit 100 has been installed in the electronic/computing device and/or during operation of the electronic/computing device, the temperature circuit 430 may configured to compensate for different temperature coefficients of different FETs.

Structures such as those shown in FIGS. 1-6 for current sensing may be referred to using functional language. In some embodiments, these structures may be described as including "means for providing a first current from a first current source to a first FET, a temperature circuit, and a power FET," "means for providing a second current from a second current source to a second FET and the temperature circuit," "means for compensating for one or more differences between one or more temperature coefficients of one or more of the first FET, the second FET, and a temperature coefficient of the power FET," "means for determining whether the first current matches a target current," "means for halting a charge cycle of a power converter circuit in response to determining that the first current matches the target current," "means for starting a charge cycle of a power converter circuit in response to determining that the first current matches the target current," "means for adjusting the resistance of one or more resistors," and "means for adjusting a current from one or more of the first current source and a second current source."

The corresponding structure for "means for providing a first current from a first current source to a first FET, a temperature circuit, and a power FET" is current sensing circuit 120 as well as equivalents of this circuit. The corresponding structure for "means for providing a second current from a second current source to a second FET and the temperature circuit" is current sensing circuit 120 as well as equivalents of this circuit. The corresponding structure for "means for compensating for one or more differences between one or more temperature coefficients of one or more of the first FET, the second FET, and a temperature coefficient of the power FET" is temperature circuit 430 as well as equivalents of this circuit. The corresponding structure for "means for determining whether the first current matches a target current" are comparator circuit 440 and/or amplifier circuit 540 and as well as equivalents of these circuits. The corresponding structure for "means for halting a charge cycle of a power converter circuit in response to determining that the first current matches the target current" is control circuit 101 as well as equivalents of this circuit. The corresponding structure for "means for starting a charge cycle of a power converter circuit in response to determining that the first current matches the target current" is control circuit 101 as well as equivalents of this circuit. The corresponding structure for "means for adjusting the resistance of one or more resistors" is current sensing circuit 120 as well as equivalents of this circuit. The corresponding structure for "means for adjusting a current from one or more of the first current source and a second current source" is current sensing circuit 120 as well as equivalents of this circuit.

Figure 7:
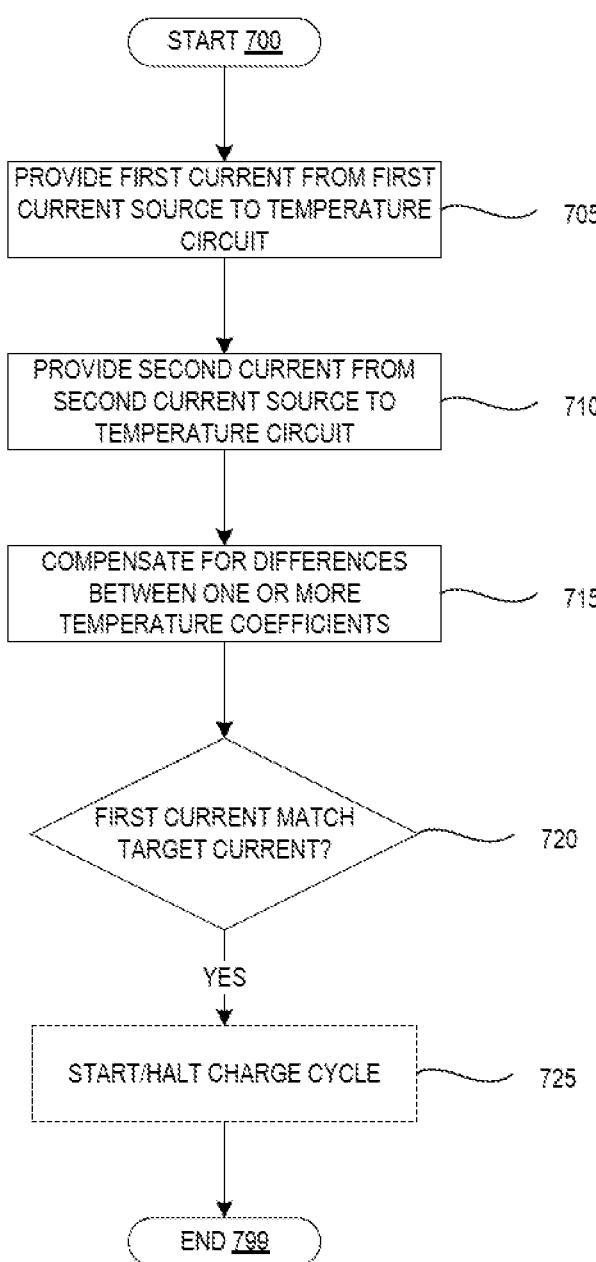
FIG. 7 illustrates a flow diagram depicting an embodiment of a method for sensing a current, in accordance with one or more embodiments of the present disclosure.

FIG. 7 illustrates a flow diagram depicting an embodiment of a method for sensing a current, in accordance with one or more embodiments of the present disclosure. The method, which may be applied to one or more of current sensing circuit 120 and/or power converter circuit 100 as depicted in FIG. 1, starts at the block 700.

The method includes providing a first current from a first current source to a temperature circuit (e.g., temperature circuit 430 illustrated in FIG. 6) at block 705. For example, the current sensing circuit may receive the first current (which may be referred to as a demand current, a charge current, etc.) from the first current source. The current sensing circuit may provide the first current to the temperature circuit via one or more wires, lines, traces, connections, nodes, etc.

The method also includes providing a second current from a second current source to the temperature circuit at block 710. For example, the current sensing circuit may receive the second current (which may be referred to as an offset current) from the second current source. The current sensing circuit may provide the first current to the temperature circuit via one or more wires, lines, traces, connections, nodes, etc.

The method further includes compensating for one or more differences between temperature coefficients of the FETs that are included in the current sensing circuit and a power FET at block 715. For example, a power FET may provide the first current to another device/circuit. The FETs of the current sensing circuit may be used to sense the amount of the first current. The temperature circuit may compensate for the differences between temperature coefficients of the FETs of the current sensing circuit and the power FET. In one embodiment, the current sensing circuit and/or temperature circuit may compensate for the differences between temperature coefficients by adjusting the resistance of one or more resistors in the temperature circuit. In another embodiment, the current sensing circuit and/or temperature circuit may compensate for the differences between temperature coefficients by adjusting the amount of second current provided by the second current source (e.g., by adjusting the offset current).

The method also includes determining whether the first current matches a target current ay block 720. For example, a comparator circuit may determine whether the first current matches the target current using the temperature circuit.

The method further includes optionally starting or halting (e.g., stopping) a charge cycle based on whether the first current matches the target current at block 725. For example, if the first current matches the target current, a control circuit may start the charge cycle. In another example, if the first current matches the target current, the control circuit may halt the charge cycle. The method ends at block 799.

Figure 8:
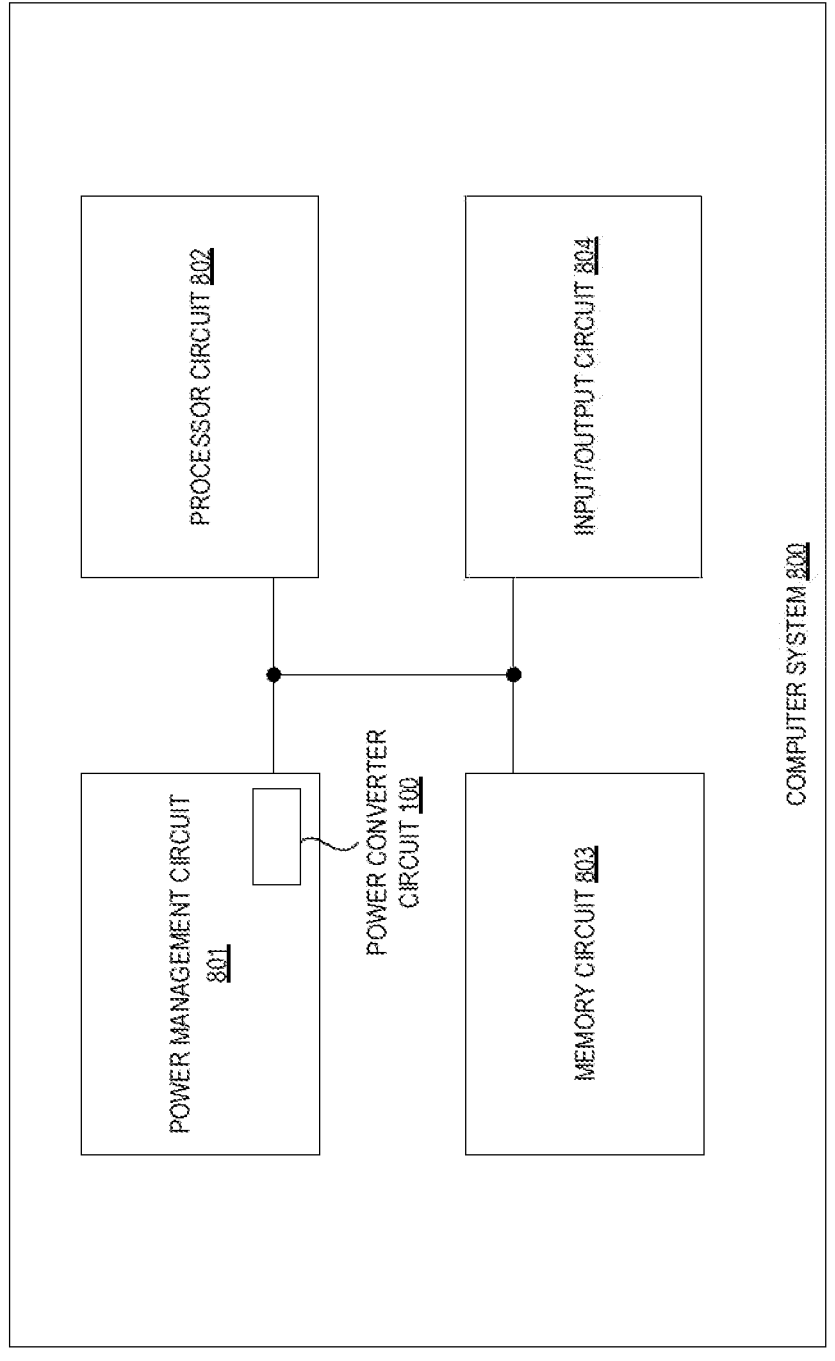
FIG. 8 illustrates a block diagram of an example computer system, in accordance with one or more embodiments of the present disclosure.

FIG. 8 illustrates a block diagram of an example computer system 800, in accordance with one or more embodiments of the present disclosure. As illustrated in FIG. 8, the computer system 800 includes power management circuit 801, processor circuit 802, memory circuit 803, and input/output circuits 804, each of which is coupled to power supply signal 805. In various embodiments, computer system 800 may be a system-on-a-chip (SoC) and/or be configured for use in a desktop computer, server, or in a mobile computing application such as, e.g., a tablet, laptop computer, or wearable computing device.

Power management circuit 801 includes power converter circuit 100, which is configured to generate a regulated voltage level on power supply signal 805 in order to provide power to processor circuit 802, memory circuit 803, and input/output circuits 804. Although power management circuit 801 is depicted as including a single power converter circuit, in other embodiments, any suitable number of power converter circuits may be included in power management circuit 801, each configured to generate a regulated voltage level on a respective one of multiple internal power supply signals included in computer system 800. In cases where multiple power converter circuits are employed, two or more of the multiple power converter circuits may be connected to a common set of power terminals that connections to power supply signals and ground supply signals of computer system 800.

Processor circuit 802 may, in various embodiments, be representative of a general-purpose processor that performs computational operations. For example, processor circuit 802 may be a central processing unit (CPU) such as a microprocessor, a microcontroller, an application-specific integrated circuit (ASIC), or a field-programmable gate array (FPGA).

Memory circuit 803 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although in a single memory circuit is illustrated in FIG. 8, in other embodiments, any suitable number of memory circuits may be employed.

Input/output circuits 804 may be configured to coordinate data transfer between computer system 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 804 may be configured to implement a version of Universal Serial Bus (USB) protocol or IEEE 1394 (Firewire®) protocol.

Input/output circuits 804 may also be configured to coordinate data transfer between computer system 800 and one or more devices (e.g., other computing systems or integrated circuits) coupled to computer system 800 via a network. In one embodiment, input/output circuits 804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 804 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a first field-effect transistor (FET) coupled to a first current source, an inductor, and a power FET, wherein the first current source is configured to generate a first current;
a second FET coupled to a second current source configured to generate a second current; and
a temperature circuit coupled to the first FET and the second FET, wherein the temperature circuit configured to adjust a value of the second current based on respective temperature coefficients of one or more of the first FET, the second FET, and the power FET.

2. The apparatus of claim 1, wherein the temperature circuit comprises:
a third FET and a fourth FET coupled in parallel;
a fifth FET and a sixth FET coupled in parallel;
a first resistor coupled to the first current source; and
a second resistor coupled to the second current source.

3. The apparatus of claim 2, wherein a gate of the third FET is coupled to the first current source, a gate of the fourth FET is coupled to the second current source, a gate of the fifth FET is coupled to the first current source; and a gate of the sixth FET is coupled to the second current source.

4. The apparatus of claim 1, wherein the inductor is coupled between the first FET and the power FET.

5. The apparatus of claim 1, further comprising:
a comparator circuit, wherein the comparator circuit includes the temperature circuit and wherein the temperature circuit comprises an input for the comparator circuit.

6. The apparatus of claim 5, wherein the comparator circuit is configured to output a signal indicating when the first current matches a target current.

7. The apparatus of claim 5, wherein the comparator circuit is coupled to a control FET and wherein the control FET is configured to start or halt a charge cycle based on a signal generated by the comparator circuit.

8. The apparatus of claim 1, wherein the temperature circuit includes one or more resistors and wherein the temperature circuit is configured to adjust one or more resistances of the one or more resistors based on the temperature coefficients of one or more of the first FET, the second FET, and the power FET.

9. The apparatus of claim 1, wherein the temperature circuit is further configured to adjust the first current based on the temperature coefficients of one or more of the first FET, the second FET, and the power FET.

10. The apparatus of claim 1, wherein the power FET is external to the apparatus.

11. A method, comprising:
providing a first current from a first current source to a first FET, a temperature circuit, and a power FET;
providing a second current from a second current source to a second FET and the temperature circuit; and
adjusting the second current based on one or more temperature coefficients of one or more of the first FET, the second FET, and a temperature coefficient of the power FET.

12. The method of claim 11, further comprising:
determining whether the first current matches a target current.

13. The method of claim 12, further comprising:
in response to determining that the first current matches the target current, halting a charge cycle of a power converter circuit.

14. The method of claim 12, further comprising:

in response to determining that the first current matches the target current, starting a charge cycle of a power converter circuit.

15. The method of claim 11, further comprising adjusting one or more resistances of one or more resistors based on one or more temperature coefficients of one or more of the first FET, the second FET, and a temperature coefficient of the power FET.

16. The method of claim 11, further comprising adjusting the first current.

17. An apparatus, comprising:

a voltage regulator circuit that includes a switch node coupled to a regulated power supply node via an inductor, wherein the voltage regulator circuit is configured to source a charge current to the switch node during a charge cycle;

a current sensing circuit comprising:

a first field-effect transistor (FET) coupled to a first current source, the inductor, and a power FET, wherein the first current source is configured to generate a first current;

a second FET coupled to a second current source configured to generate a second current; and a comparator circuit coupled to the first FET and the second FET, wherein the comparator circuit is configured to:

adjust the second current based on one or more temperature coefficients of one or more of the first FET, the second FET, and the power FET; and determine whether the charge current from the first current source matches a target current; and a control circuit configured to, in response to determining that the charge current matches the target current, start the charge cycle or stop the charge cycle.

18. The apparatus of claim 17, wherein the comparator circuit includes one or more resistors and wherein the comparator circuit is further configured to adjust one or more resistances of the one or more resistors based on one or more temperature coefficients of one or more of the first FET, the second FET, and the power FET.

19. The apparatus of claim 17, wherein the comparator circuit is configured to adjust the first current based on one or more temperature coefficients of one or more of the first FET, the second FET, and the power FET.

20. The apparatus of claim 17, wherein the inductor is coupled between the first FET and the power FET.

* * * * *